United States Patent [19]
Ishimaru

[11] Patent Number: 5,825,468
[45] Date of Patent: Oct. 20, 1998

[54] EXPOSURE SYSTEM FOR LITHOGRAPHY APPARATUS

[75] Inventor: Toshiyuki Ishimaru, Kanagawa, Japan

[73] Assignee: Sony Corporation, Japan

[21] Appl. No.: 685,814

[22] Filed: Jul. 24, 1996

[30] Foreign Application Priority Data

Jul. 24, 1995 [JP] Japan .................................. 7-208401

[51] Int. Cl.⁶ .......................... G03B 27/52; G03B 27/42; G03B 27/54
[52] U.S. Cl. .................. 355/55; 355/53; 355/67
[58] Field of Search .............................. 250/548; 355/50, 355/55, 53; 396/111, 115, 116, 118, 120

[56] References Cited

U.S. PATENT DOCUMENTS

| 4,982,226 | 1/1991 | Takahashi | 355/53 |
| 5,270,771 | 12/1993 | Sato | 355/53 |
| 5,309,197 | 5/1994 | Mori et al. | 355/53 |
| 5,361,122 | 11/1994 | Kataoka et al. | 355/53 |
| 5,502,311 | 3/1996 | Imai et al. | 250/548 |
| 5,587,794 | 12/1996 | Mizutani et al. | 356/375 |
| 5,602,399 | 2/1997 | Mizutani | 250/548 |
| 5,684,565 | 11/1997 | Oshida et al. | 355/53 |

*Primary Examiner*—R. L. Moses
*Assistant Examiner*—Shival Virmani
*Attorney, Agent, or Firm*—Ronald P. Kananen

[57] ABSTRACT

A substrate is mounted on a stage of an exposure system, and an exposure light is converged on a material formed on the substrate to form a latent image. An auto-focusing light is emitted on the latent image, and the reflected light therefrom is detected. The focusing or defocusing state is judged on the basis of the detected result. When it is judged that the exposure light is defocused on the material formed on the substrate, the drive unit is driven for focus control so as to allow the exposure light to be focused on the material formed on the substrate.

16 Claims, 2 Drawing Sheets

EXPOSURE SYSTEM FOR LITHOGRAPHY APPARATUS

BACKGROUND OF THE INVENTION

The present invention relates to an exposure system for a semiconductor device, which allows an exposure light after being emitted from a projection exposure system and transmitting a pattern of a reticle to be accurately focused on a semiconducting wafer mounted on a stage.

An exposure light after transmitting a specified pattern of a reticle is emitted on a photoresist coated on a semiconducting wafer mounted on a stage by a projection exposure system.

The focusing state of the exposure light emitted on the photoresist exerts a large effect on the accuracy in processing a highly fine structure of a semiconductor wafer.

In a usual projection exposure system, the focus control is required to be performed at a field depth of about 1.4 $\mu$m, and to satisfy such a field depth, the best focus inherent to the projection exposure system must be controlled at a value of $\pm 0.2$ $\mu$m.

The existing projection exposure system has a function capable of correcting the focusing state of an exposure light somewhat; however, the accurate judgement for the focusing state of an exposure light on a photoresist coated on a semiconducting wafer requires the development of the photoresist after exposure by the exposure light.

For example, a line-and-space of 0.35 $\mu$m is disposed at a specified distance in the Z direction of a stage of a projection exposure system, that is, in the direction of a reticle for judging a variation in focusing of an exposure light from the best focus on the basis of the line-and-space.

The method of correcting the focusing state of an exposure light in a projection exposure system from the judgement for the variation in focusing of the exposure light from the best focus on the basis of the line-and-space, however, has a fear that the variation correcting mechanism of the projection exposure system is incorrect and thereby it fails to perform the accurate correction.

The variation correcting mechanism has thus a disadvantage in that the stability in offset from the best focus of an exposure light is poor and thereby the accurate focusing of the exposure light cannot be obtained.

Such a variation correcting mechanism has another disadvantage. Namely, since the variation in focusing of an exposure light is not judged on the basis of the formation of an image on a photoresist by the exposure light, the accurate focusing of the exposure light cannot be obtained in the case where the variation correcting mechanism of the projection exposure system is incorrect.

On the other hand, there may be considered a method of forming an image on a photoresist in accordance with a pattern of a reticle by an exposure light from a projection exposure system, and judging the focusing state of the exposure light with respect to the best focus on the basis of a size and a density of the image in accordance with the pattern of the reticle. In this case, however, the photoresist must be developed, and thereby it takes a lot of time to make a judgement for the focusing state.

OBJECT AND SUMMARY OF THE INVENTION

An object of the present invention is to provide an exposure system for a semiconductor device, which is capable of stably obtaining the best focus and preventing the degradation of the shape of a photoresist, to achieve the highly accurate dimensional control, resulting in the increased manufacturing yield of a semiconductor device.

According to a first aspect of the present invention, there is provided an exposure system for a semiconductor device including: a photosensitive material formed on a substrate provided on a stage of a projection exposure system; an optical system allowing an exposure light after transmitting a pattern of a reticle to be focused on said photosensitive material for forming a latent image having a shape corresponding to the pattern of said reticle on said photosensitive material; a focusing light source for emitting a focusing light on said latent image formed on said photosensitive material; a detector for detecting the focusing light emitted to said latent image and reflected from said latent image; a pattern measuring device for measuring the reflected light detected by said detector and judging whether or not said exposure light is focused on said photosensitive material; and a drive unit for driving said stage so as to adjust a distance between said optical system and said photosensitive material in accordance with the measured result of said pattern measuring device.

According to a second aspect of the present invention, there is provided an exposure system for a semiconductor device including: a photochromic material coated on a substrate provided on a stage of a projection exposure system; an optical system allowing an exposure light after transmitting a specified pattern of a reticle to be focused on the photochromic material for forming a latent image having a shape corresponding to the pattern of the reticle on the photochromic material; an auto-focusing light source for emitting an auto-focusing light to the latent image formed on the photochromic material at a specified angle; an auto-focusing detector for detecting the auto-focusing light emitted to the latent image and reflected from the latent image; a pattern measuring device for measuring the reflected light detected by the auto-focusing detector and judging whether or not the exposure light is focused on the photochromic material; and a drive unit for driving the stage so as to adjust a gap between the optical system and the photochromic material for allowing the exposure light to be focused on the photochromic material coated on the stage in accordance with the measured result from the pattern measuring device.

In the above exposure system, preferably, the pattern measuring device makes a judgement of the best focus when it receives from the auto-focusing detector a detection output of a reflected light from a latent image formed on the photochromic material in a shape accurately corresponding to the pattern of the reticle; and makes a judgement of a defocusing state when it receives from the auto-focusing detector a detection output of a reflected light from a latent image formed on the photochromic material in a shape thinner than that of the latent image formed in the shape accurately corresponding to the pattern of the reticle.

In the present invention having the above configuration, a substrate coated with a photochromic material is provided on a stage of a projection exposure system; an exposure light after transmitting a pattern of a reticle is allowed to be focused on the photochromic material by an optical system to form a latent image having a shape corresponding to the pattern of the reticle on the photochromic material; an auto-focusing light is emitted from an auto-focusing light source on the latent image at a specified angle; and the reflected light is detected by an auto-focusing detector. Moreover, a pattern measuring device measures the detected output level and judges whether or nor the exposure light is focussed on the photochromic material. When it is judged that the exposure light is defocused on the photochromic material, the stage is moved in the direction of the optical system by a drive unit in accordance with the degree of defocusing, to thus perform auto-focus control so as to allow the exposure light to be focused on the photochromic material on the stage.

The best focus can be thus obtained, to prevent the degradation of the shape of a photoresist. This is possible to ensure the highly accurate dimensional control, resulting in the increased manufacturing yield of a semiconductor device.

DETAILED DESCRIPTION OF THE PREFERRED EMBODIMENT

Hereinafter, a preferred embodiment of an exposure system for a semiconductor device according to the present invention will be described in detail with reference to the drawings.

Figure 1:
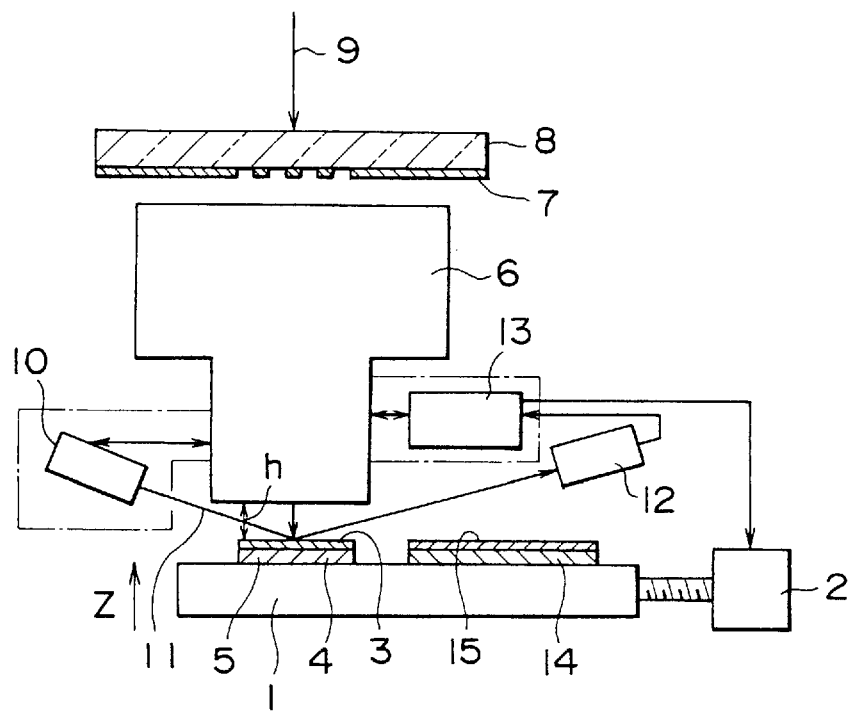
FIG. 1 is a schematic view showing the configuration of an embodiment of an exposure system for a semiconductor device according to the present invention.

FIG. 1 is a schematic view showing the configuration of an embodiment of an exposure system of the present invention.

In this figure, reference numeral 1 indicates a stage of a projection exposure system. The stage 1 is driven by a drive unit 2 mainly including a step motor so as to be displaced in the X, Y and Z directions in response to a pulse number supplied to the step motor.

The focus control (described later) for an exposure light emitted from the projection exposure system is performed by the drive of the stage 1 in the Z direction using the drive unit 2.

A substrate 4 coated with a photochromic material 3 such as silver oxide is mounted on a chuck 5 provided on the stage 1.

An optical system 6 of the projection exposure system is disposed over the photochromic material 3. The optical system 6 mainly includes a demagnification lens having a reduction ratio of 1/5.

A reticle 8 having a specified pattern 7 is disposed over the optical system 6, and an exposure light 9 from the projection exposure system is allowed to transmit the pattern 7 of the reticle 8. The exposure light 9 after transmitting the pattern 7 of the reticle 8 is converged by the optical system 6 to reduce the pattern 7 of the reticle 8 to 1/5 and image the reduced pattern on the photochromic material 3 coated on the substrate 4 provided on the stage 1. A latent image in accordance with the pattern of the reticle 8 is thus formed on the photochromic material 3.

The stage 1 can be displaced in the Z-direction by the drive unit 2 so as to have a specified distance "h" between the optical system 6 and the photochromic material 3 for focusing an image pattern.

In the projection exposure system, an auto-focusing light source 10 is provided near the optical system 6.

An auto-focusing light 11 is emitted from the auto-focusing light source 10 onto the surface of the photochromic material 3. The auto-focusing light 11 is reflected from a latent image formed on the photochromic material 3.

The auto-focusing light 11 reflected from the latent image formed on the photochromic material 3 is detected by an auto-focusing detector 12.

The detected result of the auto-focusing detector 12 is outputted to a pattern measuring device 13.

The drive unit 2 receives the output of the pattern measuring device 13, and as described above, it moves the stage 1 in the Z direction for allowing the exposure light 9 to be focused on the photochromic material 3.

A wafer chuck 14 is disposed in the vicinity of the chuck 5 on the stage 1, and a wafer 15 is mounted on the wafer chuck 14.

When it is judged that the latent image is formed on the photochromic material 3 in an accurately focusing state of the exposure light 9, the wafer 15 is actually exposed on the exposure light 9 in accordance with the pattern of the reticle, to manufacture a semiconductor device.

Next, the function of the exposure system having the above configuration will be described.

The substrate 4 coated with the photochromic material 3 is mounted on the chuck 5 of the stage 1, and the reticle 8 having the specified pattern 7 is mounted between a light source (not shown) for the exposure light 9 and the optical system 6 in the projection exposure system.

The pattern 7 formed on the reticle 8 is, for example, a 1 $\mu$m line-and-space pattern in which bars and spaces are alternately arranged at intervals of 1 $\mu$m.

Next, the exposure light 9 emitted from the light source is allowed to transmit the pattern 7 of the reticle 8 and converged by the optical system 6, to expose the photochromic material 3 mounted on the substrate 4 in accordance with the pattern 7 reduced at a reduction ratio of 1/5.

In this case, the focusing of the exposure light 9 on the photochromic material 3 is possible by displacement of the stage 1 mounting the substrate 4 in the Z direction, that is, in the vertical direction using the drive unit 2.

At the same time, the auto-focusing light source 10 emits the auto-focusing light 11 on the surface of the photochromic material 3 on which the latent image is formed. The auto-focusing light 11 is reflected from the surface of the photochromic material 3.

The auto-focusing light 11 thus reflected is received by the auto-focusing detector 12 for detecting the latent image.

In this case, since the auto-focusing light source 10 is fixed while the stage 1 is finely movable in the Z direction for focusing of an exposure light by the drive unit, the distance "h" between the surface of the photochromic material 3 of a substrate 4 on a stage 1 and an optical system is changed in accordance with the vertical movement of the stage 1, and consequently the incident angle and reflection angle of the auto-focusing light 11 with respect to the surface of the photochromic material 3 are changed.

The auto-focusing detector 12 detects a variable intensity of the auto-focusing light 11 reflected from the latent image and output the detection result to the pattern measuring device 13. It is noted that the intensity of the auto-focusing light 11 is variable in accordance with the change in the reflected angle of the auto-focusing light 11.

Here, there will be described a relationship between a latent image formed on the photochromic material 3 coated on the substrate 4 and the exposure light 9 focused or defocused on the surface of the photochromic material 3.

Figure 2:
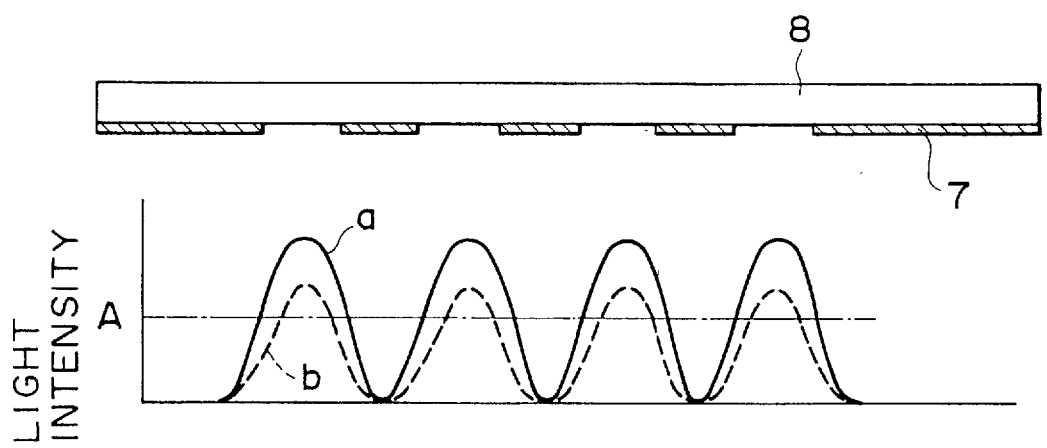
FIG. 2 is a graph showing a light intensity of an exposure light focused or defocused on the photochromic material to form a latent image in accordance with a pattern of a reticle thereon, for illustrating the exposure system for a semiconductor device.

FIG. 2 shows a light intensity of an exposure light for formation of latent image in accordance with the pattern 7 of the reticle 8 on the photochromic material 3. In this figure, a solid line "a" shows a light intensity of the exposure light 9 focused on the surface of the photochromic material 3 coated on the substrate 4 while a broken line "b" shows a light intensity of the exposure light 9 defocused on the surface of the photochromic material 3 on the substrate 4.

As is apparent from FIG. 2, the light intensity of the exposure light 9 focused on the surface of the photochromic material 3 is larger than that of the exposure light 9 defocused on the surface of the photochromic material 3.

Figure 3:
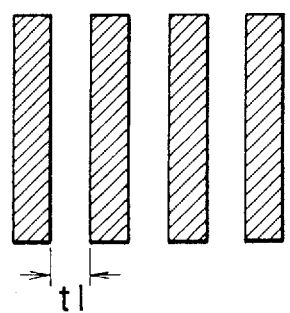
FIG. 3 is a view showing a latent image formed on the surface of the photochromic material in accordance with a pattern of a reticle by an exposure light focused on the surface of the photochromic material, using the exposure system shown in FIG. 1.

In the case where the photochromic material 3 is exposed for a specified period of time by the exposure light 9 focused or defocused on the surface of the photochromic material 3, by phase-reversal of the light intensity at a threshold level A in FIG. 2, the latent image in accordance with the pattern 7 of the reticle 8 is formed on the photochromic material 3 by the exposure of the exposure light 9 focused thereon in such a large shape as shown in FIG. 3 (the width of the pattern is thick and the width t1 of the space is thin).

Figure 4:
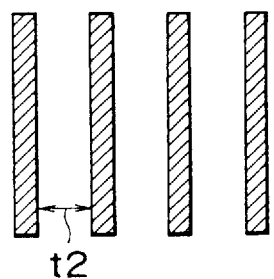
FIG. 4 is a view showing a latent image formed on the surface of the photochromic material in accordance with a pattern of a reticle by an exposure light defocused on the surface of the photochromic material, using the exposure system shown in FIG. 1.

On the contrary, upon defocusing of the exposure light 9, the light intensity of the exposure light 9 on the surface of the photochromic material 3 coated on the substrate 4 is reduced, so that the latent image in accordance with the pattern 7 of the reticle is formed on the photochromic material 3 in such a small shape as shown in FIG. 4 (the width of the pattern is thin and the width t2 of the space is thick).

While the light intensity of the exposure light 9 emitted on the surface of the photochromic material 3 is variable depending on the focusing state of the exposure light 9 on the surface of the photochromic material 3, such a variable light intensity is detected by a method wherein the auto-focusing light 11 from the auto-focusing light source 10 is reflected from the latent image on the photochromic material 3 and the reflected light is detected by the auto-focusing detector 12 as described above.

More specifically, when the exposure light 9 is focused on the surface of the photochromic material 3 (upon best focus), the distance "h" between the surface of the photochromic material 3 and the optical system 9 is suitable. At this time, the auto-focusing light 11 emitted from the auto-focusing light source 10 enters the surface of the photochromic material 3 at a suitable incident angle, and is reflected from a latent image formed in a thick pattern as shown in FIG. 3 at a suitable reflected angle, to be thus detected by the auto-focusing detector 12.

On the other hand, when the exposure light 9 is defocused on the surface of the photochromic material 3, the distance "h" between the surface of the photochromic material 3 and the optical system 6 is out of a suitable value. At this time, the auto-focusing light 11 emitted from the auto-focusing light source 10 enters the surface of the photochromic material 3 at an incident angle which is different from that obtained upon focusing in accordance with a change in the distance "h", and reflected from the latent image.

As a result, upon defocusing of the exposure light 9, the latent image is small and also the auto-focusing light 11 is reflected from a portion somewhat offset from the position where the latent image is formed, so that the amount of the incident light received by the auto-focusing detector 12 is reduced.

In this way, the amount of the incident light received by the auto-focusing detector 12 is increased or decreased depending on focusing or defocusing of the exposure light 9 on the surface of the photochromic material 3, and the detected result corresponding to such a change in the amount of the incident light is outputted from the auto-focusing detector 12 to the pattern measuring device 13.

The pattern measuring device 13 receives the detected result of the auto-focus detector 12 and makes a judgement whether or not the exposure light 9 is focused on the surface of the photochromic material 3 on the basis of the magnitude of the latent image formed on the photochromic material 3.

The judgement is made under a standard that the distance "h" between the surface of the photochromic material 3 and the optical system 6 is regarded as a suitable value when the output from the auto-focusing detector 12 is a maximum value. In other words, when the dimension of the latent image is maximized as shown in FIG. 5, it is judged that the exposure light 9 is focused on the surface of the photochromic material 3.

Figure 5:
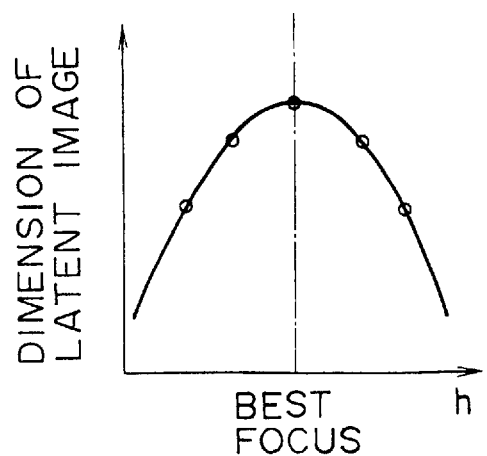
FIG. 5 is a view showing a relationship between a distance between the surface of the photochromic material of a substrate on a stage and an optical system and the dimension of a latent image upon formation of a latent image on the surface of the photochromic material in accordance with a pattern of a reticle by an exposure light focused or defocused on the surface of the photochromic material, using the exposure system shown in FIG. 1.

FIG. 5 is a graph showing a relationship between the dimension of a latent image and the distance "h" between the surface of the photochromic material of the substrate on the stage 1 and the optical system 6, wherein the abscissa indicates the distance "h" and the ordinate indicates the dimension of the latent image.

When the output from the auto-focusing detector 12 is gradually reduced from the maximum value, the distance "h" between the surface of the photochromic material 3 and the optical system 6 is out of a suitable value (larger or smaller than the above suitable value in the focusing state of the exposure light 9). This shows the defocusing state of the exposure light 9. In other words, when dimension of the latent image is smaller than the maximum value, it is judged that the exposure light 9 is defocused on the surface of the photochromic material 3.

As is apparent from FIG. 5, the auto-focusing measuring device 13 thus determines that the maximum dimension of a latent image corresponding to the maximum output of the auto-focusing detector 12 is regarded as the optimum dimension "h" and the position of the latent image having the maximum dimension is regarded as the best focus position.

When it is judged that the output from the auto-focusing detector 12 is not the output corresponding to the best focus position on the basis of the calculation of the auto-focusing measuring device 13, the drive unit 2 is driven in response of a signal supplied from the auto-focusing measuring device 13 to move the stage 1 in the Z direction until the auto-focusing detector 12 outputs the detected result corresponding to the above maximum dimension of the latent image, thereby performing the focus control to give the best focus of the exposure light 9 on the surface of the photochromic material 3.

The best focus of the exposure light 9 can be thus stably obtained, to prevent the degradation of the shape of a photoresist in manufacture of a semiconductor device. As a result, it is possible to ensure the highly accurate dimensional control, resulting in the increased manufacturing yield of a semiconductor device.

After the best focus is obtained, the stage 1 is controlled to be moved in the X and Y directions by the drive unit 2, to move a wafer mounted on the wafer chuck 14 of the stage 1 to the above focusing position of the exposure light 9, followed by an exposure step for a semiconductor device manufacturing in which the wafer is exposed on the exposure light 9 in accordance with a specified pattern of the reticle.

As described above, according to the present invention, an auto-focusing light is emitted on a latent image formed by exposure correspondingly to a pattern of a reticle on the surface of a photochromic material coated on a substrate provided on a stage, and the magnitude of the latent image is measured by the auto-focusing light reflected from the latent image, wherein when the measured magnitude of the latent image is a maximum value, the focusing state is regarded as the best focus; and when the measured value is not maximized, the stage is moved in the Z direction for focus control until the maximum value is obtained. The best focus of an exposure light can be thus stably obtained, to prevent the degradation of the shape of a photoresist. As a result, it is possible to ensure the highly accurate dimensional control, resulting in the increased manufacturing yield of a semiconductor device.

What is claimed is:

1. An exposure system for a semiconductor device comprising:
   a photosensitive material formed on a substrate provided on a stage of a projection exposure system;
   an optical system allowing an exposure light after transmitting a pattern of a reticle to be focused on said photosensitive material for forming a latent image having a shape corresponding to the pattern of said reticle on said photosensitive material;
   a focusing light source for emitting a focusing light on said latent image formed on said photosensitive material;
   a detector for detecting the focusing light reflected from said latent image, said reflected focusing light being characteristic of accuracy of said focusing of said exposure light on said photosensitive material;
   a pattern measuring device for measuring the reflected light detected by said detector and judging whether or not said exposure light is focused on said photosensitive material; and
   a drive unit for driving said stage so as to adjust a vertical distance between said optical system and said photosensitive material in accordance with the measured result of said pattern measuring device.

2. An exposure system for a semiconductor device according to claim 1, wherein said photosensitive material is a photochromic material.

3. An exposure system for a semiconductor device according to claim 1, wherein the pattern of said reticle is formed to have rectangular slits.

4. An exposure system for a semiconductor device according to claim 1, wherein said substrate is disposed adjacently to a wafer chuck.

5. An exposure system for a semiconductor device according to claim 1, wherein said focusing light enters the surface of said photosensitive material at a specified angle.

6. An exposure system for a semiconductor device according to claim 5, wherein said focusing light enters the surface of said photosensitive material at a tilting angle.

7. An exposure system for a semiconductor system according to claim 2, wherein said pattern measuring device makes a judgement of the best focus when it receives from said detector a detection output of a reflected light from a latent image formed on said photochromic material in a shape accurately corresponding to the pattern of said reticle; and makes a judgement of a defocusing state when it receives from said detector a detection output of a reflected light of a latent image formed on said photochromic material in a shape different from the pattern of said reticle.

8. An exposure system for a semiconductor device according to claim 7, wherein a reflected light from said latent image formed on said photochromic material in a shape accurately corresponding to the pattern of said reticle is set at a maximum value.

9. An exposure system for a semiconductor device according to claim 7, wherein said latent image formed on said photochromic material in a shape different from the pattern of said reticle has a pattern thinner than that of said latent image formed in the shape accurately corresponding to the pattern of said reticle.

10. An exposure system for a semiconductor device according to claim 1, wherein an incident angle and reflected intensity of said reflected focusing light is characteristic of accuracy of said focusing of said exposure light on said photosensitive material.

11. An exposure system for a semiconductor device, comprising:
    a photochromic material coated on a substrate provided on a stage of a projection exposure system;
    means for forming a latent image on said photochromic material by allowing an exposure light to transmit through a specified pattern of a reticle, said latent image having a shape corresponding to said specified pattern;
    means for emitting an auto-focusing light at a specified angle to said latent image;
    means for detecting said auto-focusing light reflected from said latent image, said reflected auto-focusing light being characteristic of accuracy of focusing of said exposure light on said photochromic material;
    a pattern measuring device for measuring the reflected light detected by said detecting means and judging the size of said latent image depending on whether or not said exposure light is focused on said photochromic material; and
    a drive unit for driving said stage so as to adjust a distance between said forming means and said photochromic material for allowing said exposure light to be focused on said photochromic material coated on said stage in accordance with the measured result from said pattern measuring device.

12. An exposure system for a semiconductor device according to claim 11, wherein said pattern measuring device makes a judgment of the best focus when it receives from said detecting means a detection output of a light reflected from said latent image in a shape accurately corresponding to the pattern of said reticle; and makes a judgment of a defocusing state when it receives from said detecting means a detection output of a light reflected from said latent image in a shape thinner than that of said latent image formed in the shape accurately corresponding to the pattern of said reticle.

13. An exposure system for a semiconductor device according to claim 11, wherein the pattern of said reticle is formed to have rectangular slits.

14. An exposure system for a semiconductor device according to claim 11, wherein said substrate is disposed adjacently to a wafer chuck.

15. An exposure system for a semiconductor device according to claim 11, wherein said auto-focusing light enters a surface of said photochromic material at a tilting angle.

16. A method of exposing a photosensitive material through a pattern of a reticle, comprising the steps of:

placing a substrate with a photosensitive material provided thereon on a stage of a projection exposure system, said system comprising an exposure light source, an optical system, a focusing light source, a detecting means, a measuring means, and a driving means;

emitting an exposure light from said exposure light source through a pattern of a reticle;

focusing said exposure light by means of said optical system on said photosensitive material;

forming a latent image on said photosensitive material, said latent image having a shape corresponding to said pattern of said reticle;

emitting a focusing light onto said latent image from said focusing light source;

detecting said focusing light reflected from said latent image into said detecting means, an incident angle and a reflected intensity of said reflected focusing light being characteristic of accuracy of said focusing;

measuring said detected focusing light in said measuring means for judging whether or not said exposure light is focused on said photosensitive material; and driving said stage by means of said driving means so as to adjust a distance between said optical system and said photosensitive material in accordance with results of said measuring.

\* \* \* \* \*